(12) United States Patent
Kondo et al.

(10) Patent No.: US 9,823,065 B2
(45) Date of Patent: Nov. 21, 2017

(54) SURFACE MEASUREMENT APPARATUS

(71) Applicant: Hitachi High-Technologies Corporation, Minato-ku, Tokyo (JP)

(72) Inventors: Takanori Kondo, Tokyo (JP); Takahiro Jingu, Tokyo (JP); Masaaki Ito, Tokyo (JP); Masami Ikota, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/759,798

(22) PCT Filed: Jan. 10, 2014

(86) PCT No.: PCT/JP2014/050266
§ 371 (c)(1),
(2) Date: Jul. 8, 2015

(87) PCT Pub. No.: WO2014/115586
PCT Pub. Date: Jul. 31, 2014

(65) Prior Publication Data
US 2015/0354947 A1 Dec. 10, 2015

(30) Foreign Application Priority Data

Jan. 23, 2013 (JP) ................................. 2013-009740

(51) Int. Cl.
*G01B 11/30* (2006.01)
*G01Q 60/24* (2010.01)
(Continued)

(52) U.S. Cl.
CPC ............ *G01B 11/303* (2013.01); *G01B 11/24* (2013.01); *G01Q 60/24* (2013.01); *H01L 22/12* (2013.01);
(Continued)

(58) Field of Classification Search
CPC ....... G01B 11/303; G01B 11/24; G01Q 60/24
(Continued)

(56) References Cited

U.S. PATENT DOCUMENTS 7,349,090 B2 * 3/2008 Wack .................. G01N 21/211
356/369
7,990,546 B2 * 8/2011 Yeo ..................... G01N 21/9501
356/237.1

(Continued)

FOREIGN PATENT DOCUMENTS

JP 2002-340811 A 11/2002
JP 2006-54358 A 2/2006
(Continued)

OTHER PUBLICATIONS

Japanese-language Office Action issued in counterpart Japanese Application No. 2014-558521 dated Aug. 2, 2016 with English translation (Four (4) pages).

(Continued)

*Primary Examiner* — Tarifur Chowdhury
*Assistant Examiner* — Isiaka Akanbi
(74) *Attorney, Agent, or Firm* — Crowell & Moring LLP

(57) ABSTRACT

The invention discloses a technique that estimates micro roughness from a total sum of detection signals from plural detection systems and signal ratios, using a light scattering method. The technique rotates and translates a wafer at high speed to measure the entire surface of the wafer with high throughput. The relationship between the micro roughness and the intensity of scattered light varies according to a material of the wafer and a film thickness thereof. Moreover, calibration of an apparatus is also necessary. Thus, for instance, the invention provides a technique that has a function of correcting an optically acquired detection result using a sample which is substantially the same as a measurement target and makes the optically acquired detection result come close to a result measured by an apparatus, such as an AFM, using a different measurement principle.

25 Claims, 15 Drawing Sheets

(51) Int. Cl.
*G01B 11/24* (2006.01)
*H01L 21/66* (2006.01)
(52) U.S. Cl.
CPC .......... *H01L 22/20* (2013.01); *G01B 2210/56* (2013.01)
(58) Field of Classification Search
USPC ............................ 356/600–614, 237.2–237.6
See application file for complete search history.

(56) References Cited

U.S. PATENT DOCUMENTS

| | | | |
|---|---|---|---|
| 9,311,697 B2* | 4/2016 | Harada | ................... H01L 22/12 |
| 2010/0004875 A1 | 1/2010 | Urano et al. | |
| 2013/0278926 A1 | 10/2013 | Takahashi et al. | |
| 2014/0198321 A1* | 7/2014 | Ito | ....................... G01B 11/303 |
| | | | 356/612 |

FOREIGN PATENT DOCUMENTS

| | | |
|---|---|---|
| JP | 2008-501120 A | 1/2008 |
| JP | 2010-14635 A | 1/2010 |
| WO | WO 2005/119170 A2 | 12/2005 |
| WO | WO 2012/090392 A1 | 7/2012 |

OTHER PUBLICATIONS

International Search Report (PCT/ISA/210) dated Mar. 11, 2014, with English translation (two (2) pages).

* cited by examiner

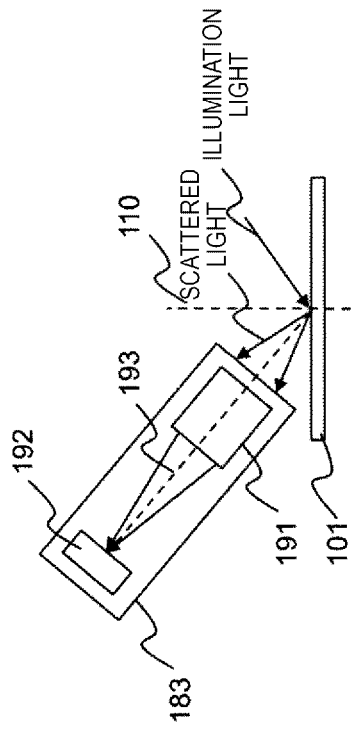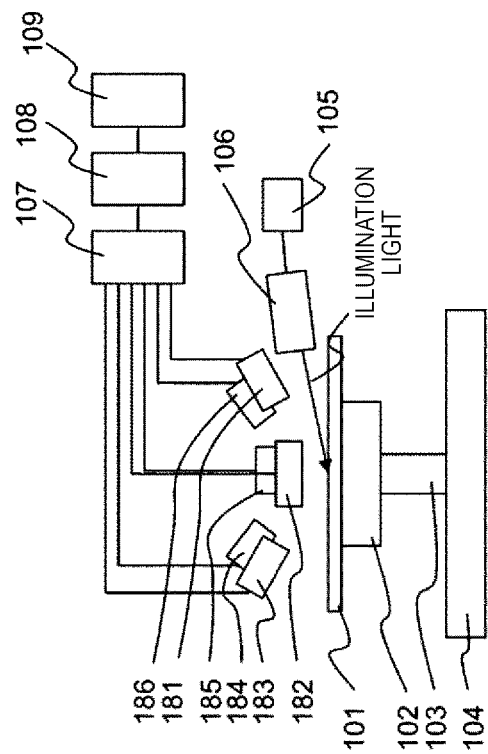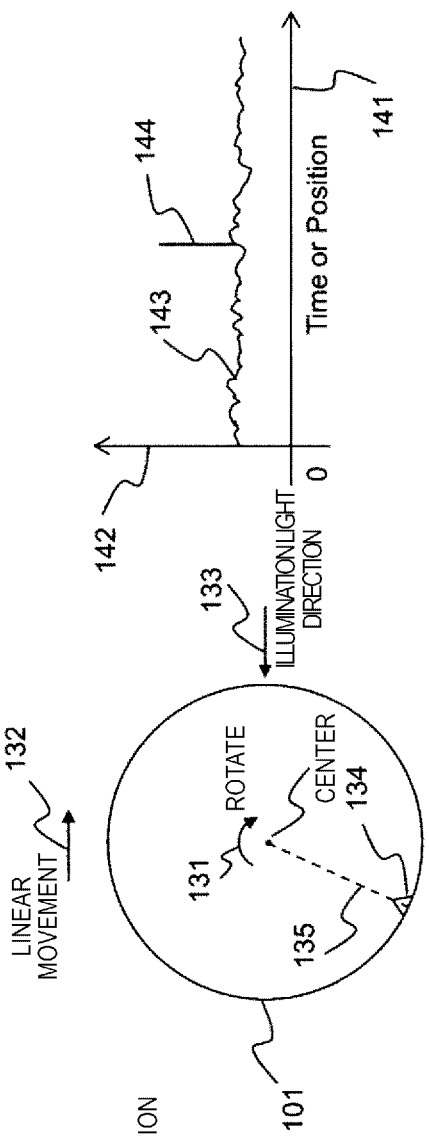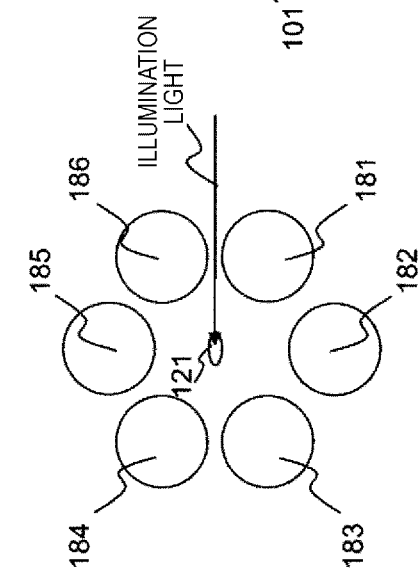

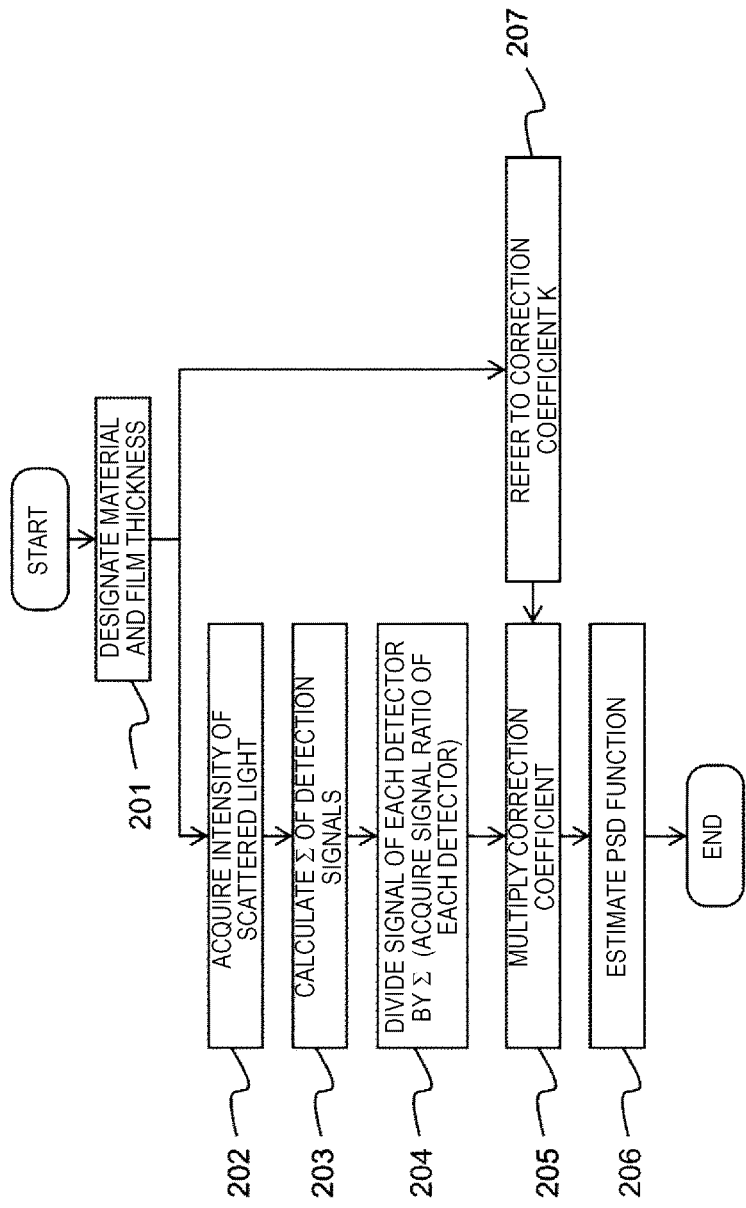

[Fig. 3C]
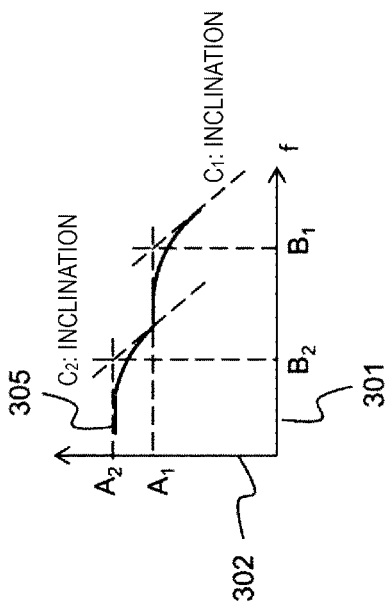
[Fig. 3A]
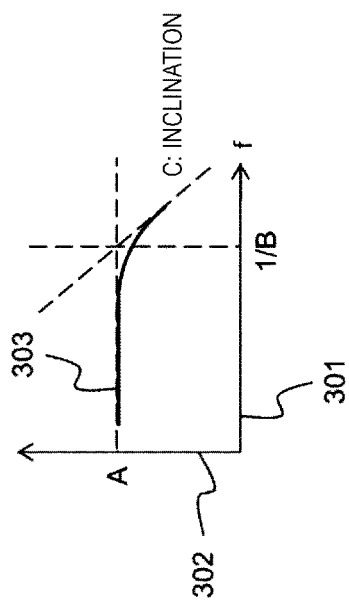
[Fig. 3B]
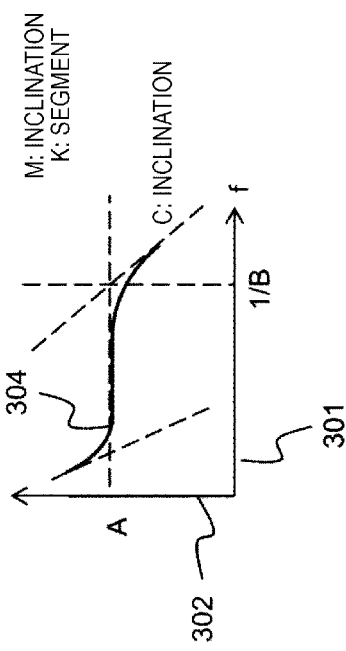

[Fig. 4]
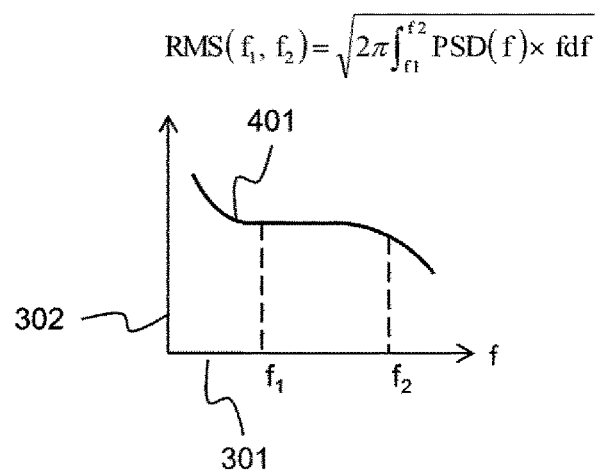
[Fig. 5]
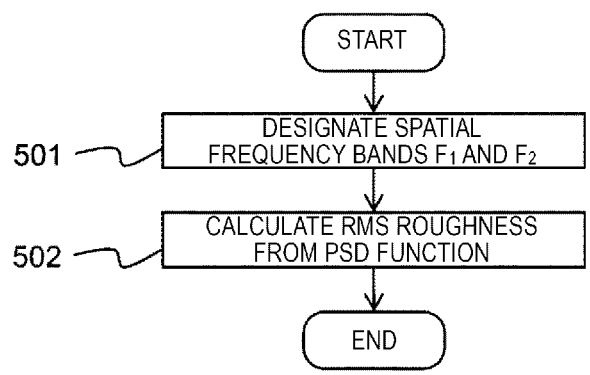

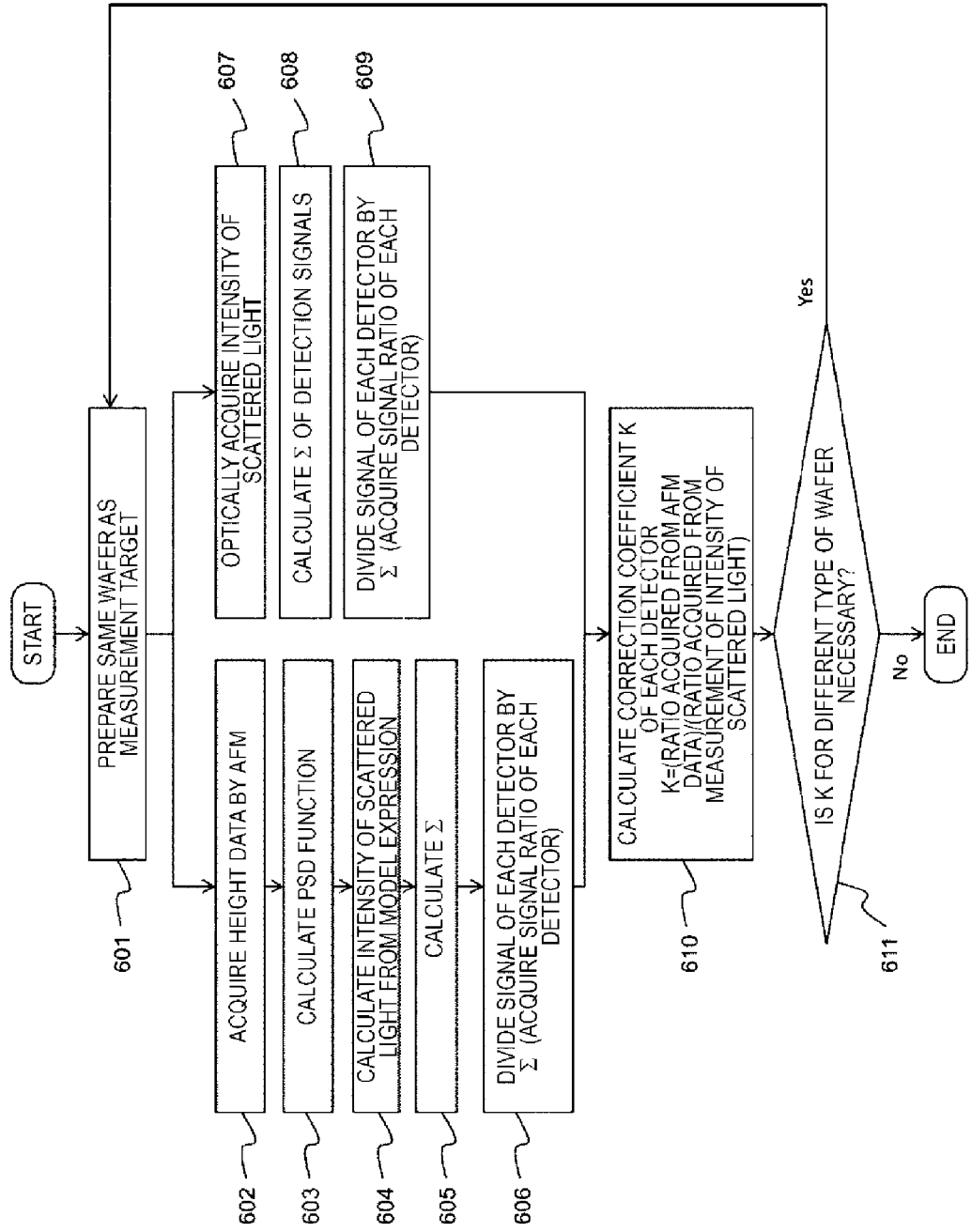

[Fig. 7]
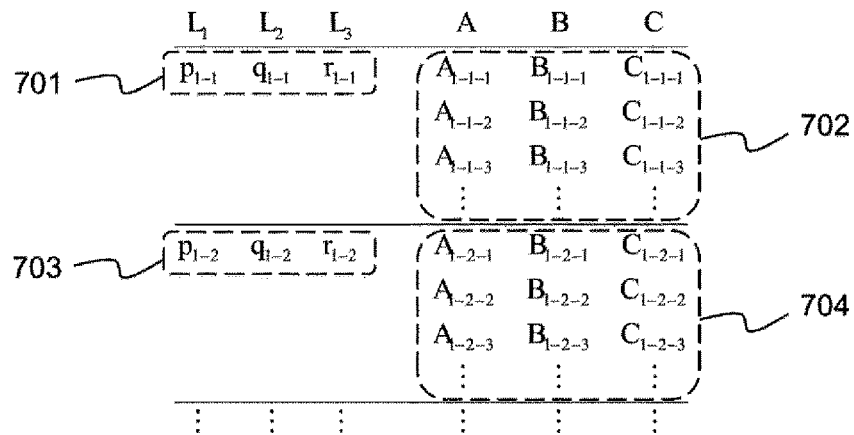
[Fig. 8]
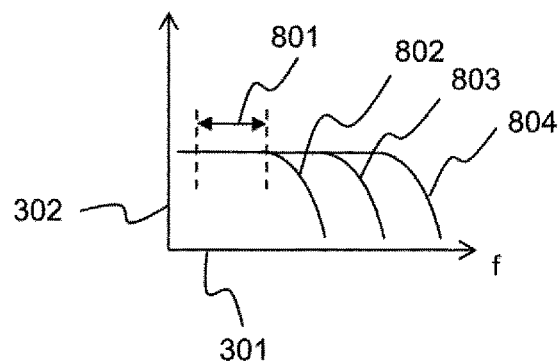
[Fig. 9]
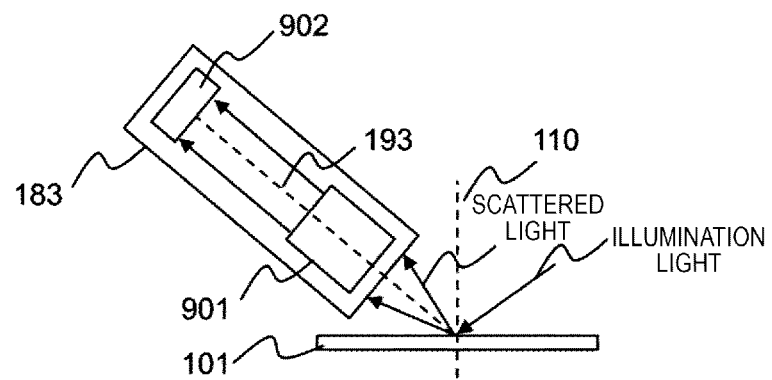

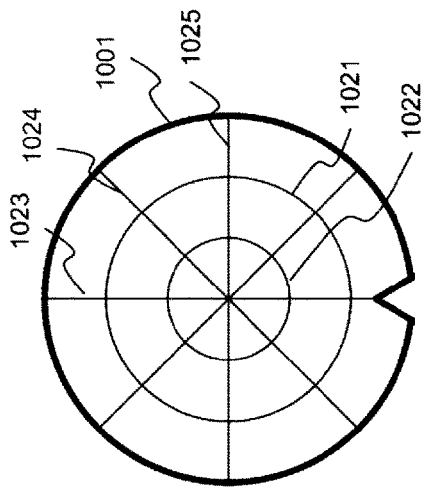
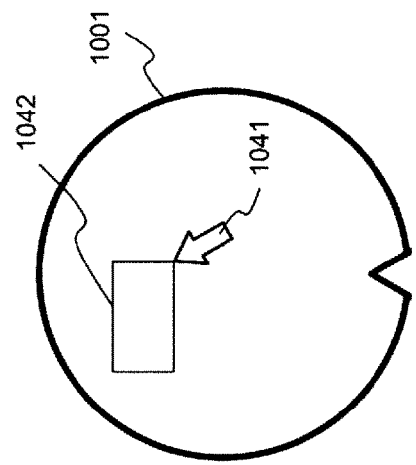
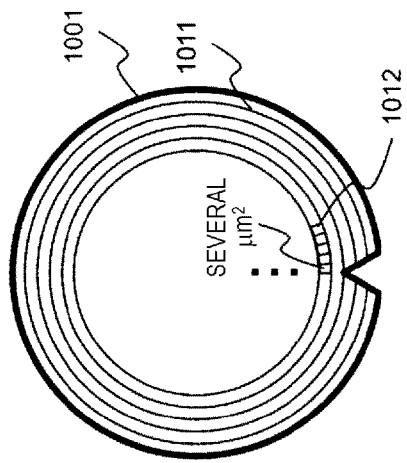
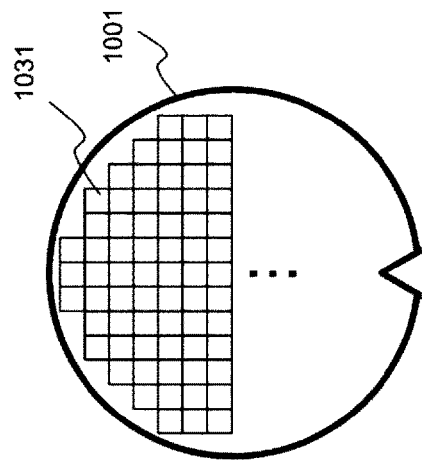

[Fig. 11]
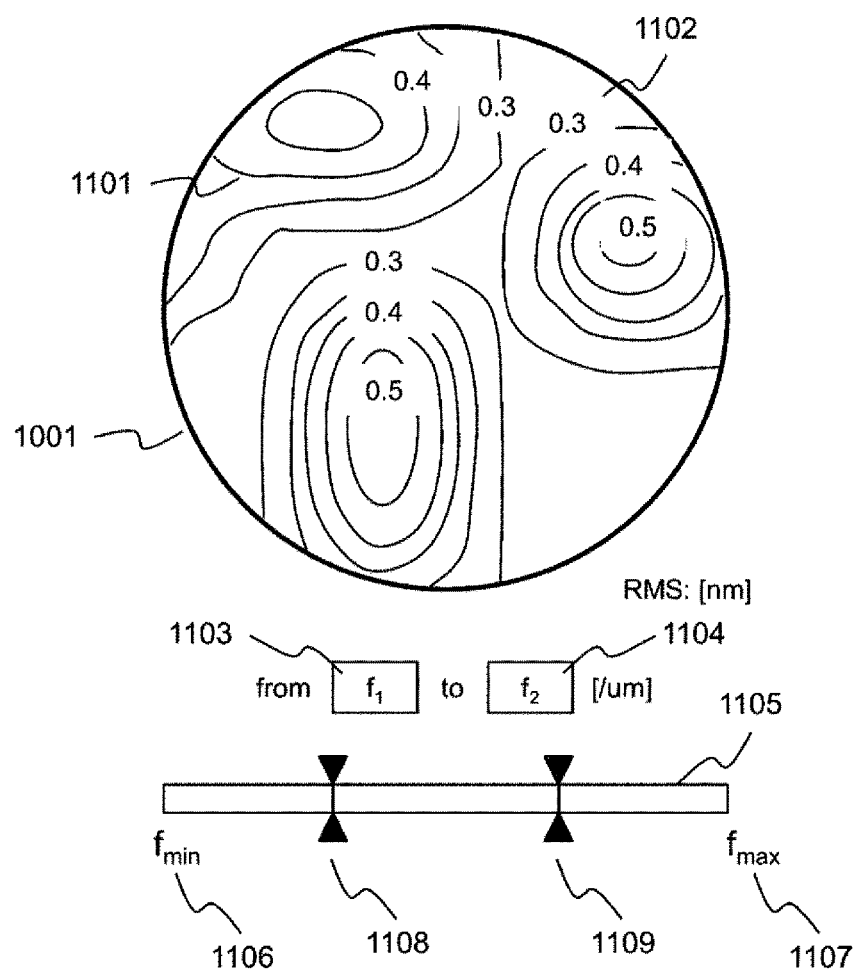

[Fig. 12A]
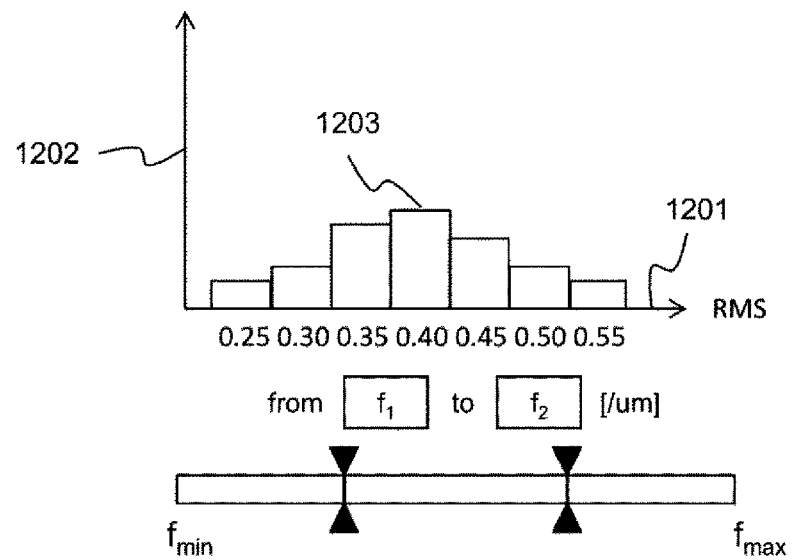
[Fig. 12B]
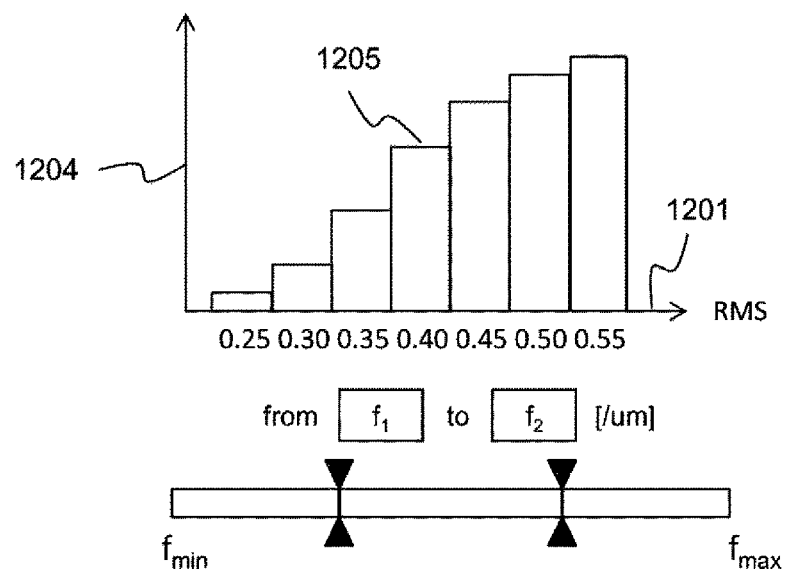

[Fig. 13]
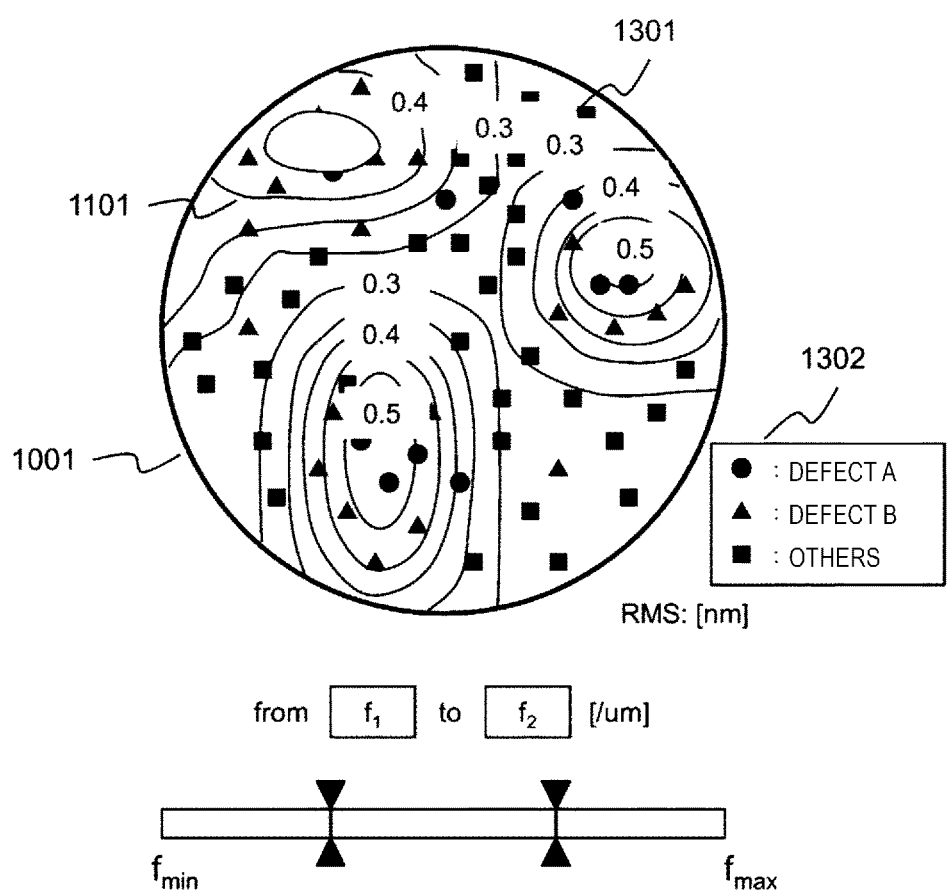

[Fig. 14A]
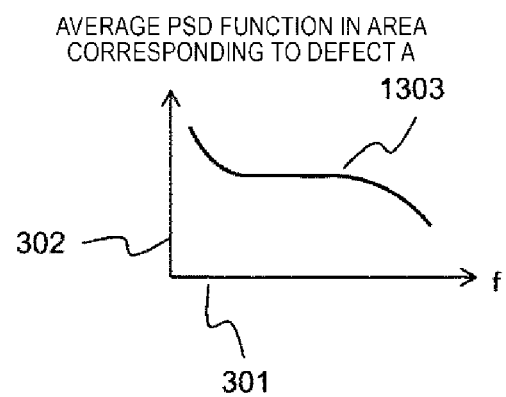
[Fig. 14B]
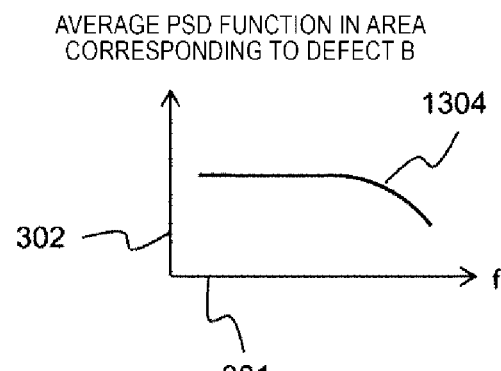
[Fig. 14C]
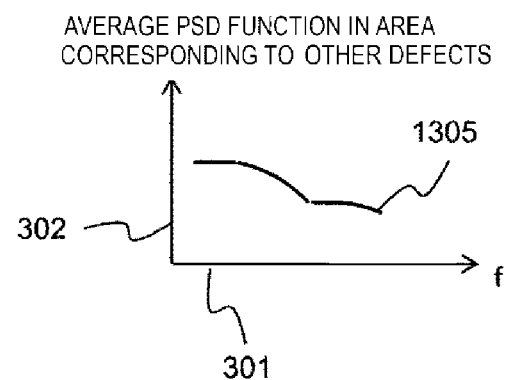

[Fig. 15A]
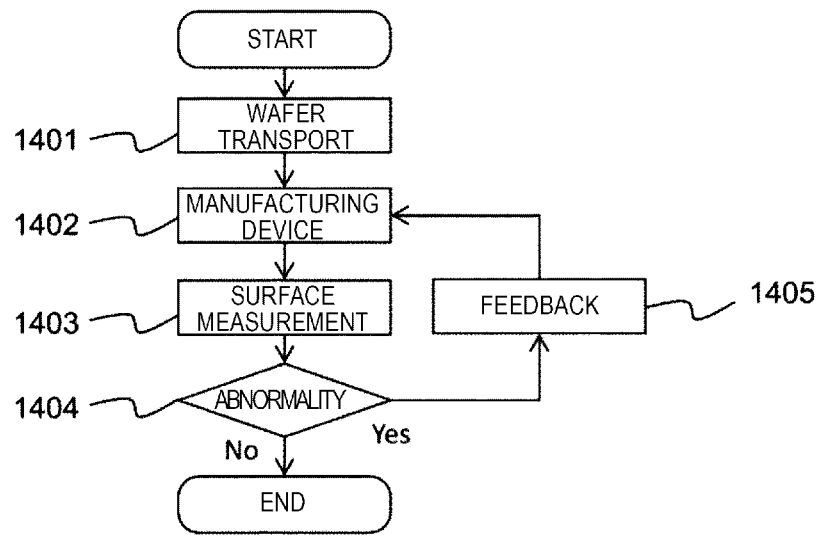
[Fig. 15B]
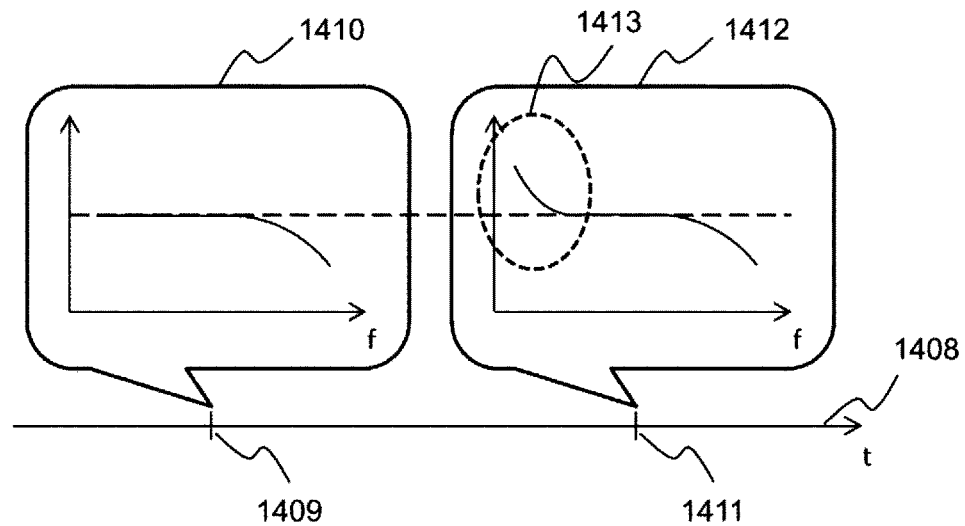
[Fig. 16]
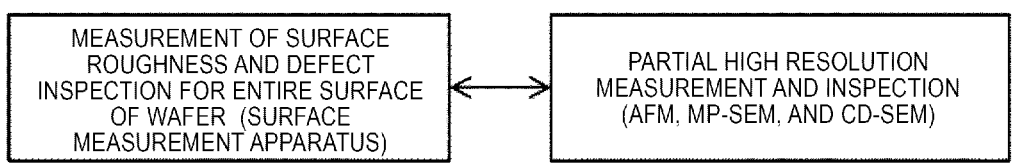

[Fig. 17A]
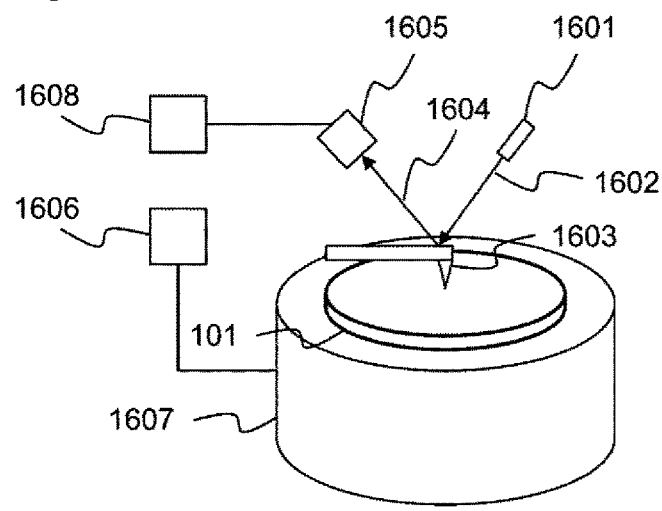
[Fig. 17B]
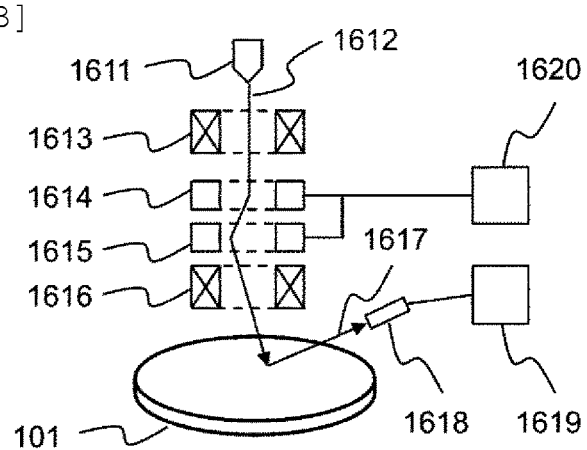

[Fig. 18]
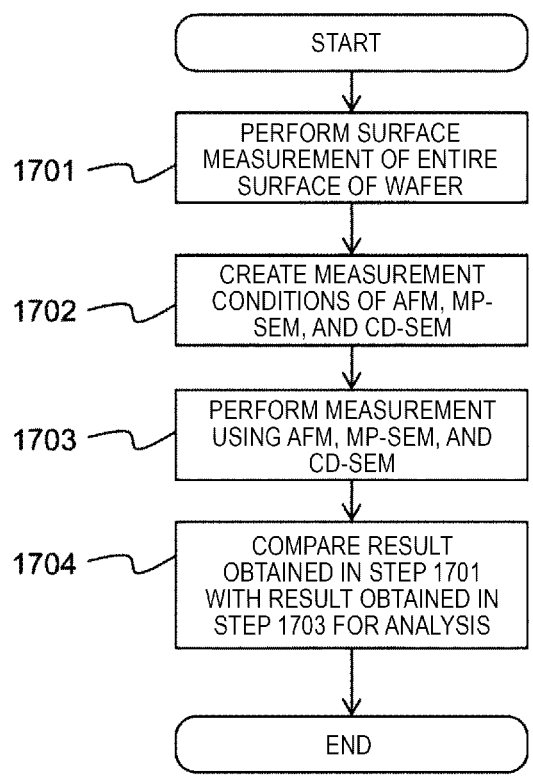

[Fig. 19]
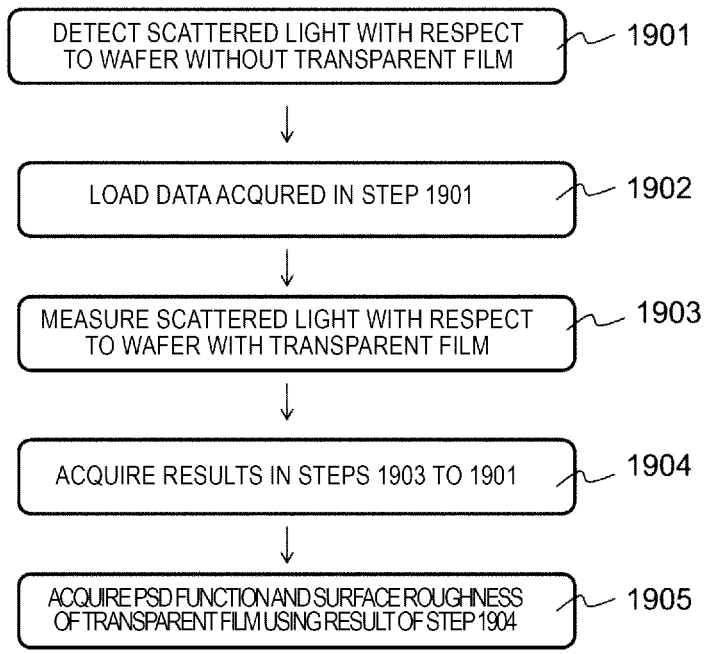

SURFACE MEASUREMENT APPARATUS

TECHNICAL FIELD

The present invention relates to a surface shape measurement apparatus for acquiring a surface shape. For example, the invention relates to a measurement apparatus of measuring a surface shape using a light scattering method, more particularly, of measuring micro roughness on a wafer surface or the like in a semiconductor device manufacturing process.

BACKGROUND ART

Since micro roughness of a semiconductor wafer is greatly involved in performance of an apparatus, management thereof is important. In measurement of the micro roughness, it is preferable to inspect entire semiconductor wafers and the entire surface thereof in an in-line manner, which demands high speed measurement. As a related art, the following document is referred to.

CITATION LIST

Patent Literature

PTL 1: JP-A-2006-54358

SUMMARY OF INVENTION

Technical Problem

PTL 1 discloses a technique in which height measurement using an atomic force microscope (AFM) is used as means for measuring micro roughness. However, this technique does not provide consideration for the problem that it takes time for the measurement.

Solution to Problem

The invention provides a technique capable of estimating micro roughness from a total sum of signals from plural detection systems and a signal ratio using a light scattering method.

The invention provides a technique that rotates and translates a wafer at high speed to measure the entire surface of the wafer with high throughput.

Further, the relationship between micro roughness and the intensity of scattered light varies according to a material of the wafer or a film thickness thereof. Further, it is also necessary to calibrate an apparatus. In consideration of the problems, the invention provides a technique that has a function of correcting a detection result that is optically acquired using a sample which is substantially the same as a measurement target and makes the optically acquired detection result come close to a result measured by an apparatus (for example, an AFM) using a different measurement principle.

Advantageous Effects of Invention

According to the invention, it is possible to acquire information necessary for process management of a wafer in a short amount of time.

BRIEF DESCRIPTION OF DRAWINGS

FIGS. 1A-1E are diagrams illustrating a surface measurement apparatus according to Embodiment 1.

FIG. 2 is a diagram illustrating a flow for estimating a spatial frequency spectrum (PSD function) of micro roughness from the intensity of scattered light that is measured.

FIGS. 3A-3C are diagrams illustrating a PSD function.

FIG. 4 is a diagram illustrating a relationship between a PSD function and a surface roughness.

FIG. 5 is a diagram illustrating a flow for calculating a surface roughness from a PSD function.

FIG. 6 is a flowchart illustrating a calculation method of a correction coefficient k used in calibration of an apparatus.

FIG. 7 is a diagram illustrating a model parameter output example of a PSD function with respect to a certain intensity of scattered light.

FIG. 8 is a diagram illustrating a reason why plural ABC parameters correspond to a set of signal ratios.

FIG. 9 is a diagram illustrating a Fourier transform optical system.

FIGS. 10A-10D are diagrams illustrating a unit area for averaging acquired data in Embodiment 2.

FIG. 11 is a diagram illustrating a display example of a surface roughness in a desired spatial frequency band.

FIGS. 12A-12B are diagrams illustrating an example in which a surface roughness is displayed using a histogram.

FIG. 13 is a diagram illustrating an example in which a surface roughness and a defect inspection result are displayed in association.

FIGS. 14A-14C are diagrams illustrating correspondence between a defect type and a surface roughness.

FIGS. 15A-15B are diagrams illustrating Embodiment 3.

FIG. 16 is a conceptual diagram illustrating Embodiment 4.

FIGS. 17A-17B are diagrams illustrating outlines of an AFM, a CD-SEM, and an MP-SEM.

FIG. 18 is a flowchart illustrating Embodiment 4.

FIG. 19 is a flowchart illustrating Embodiment 5.

DESCRIPTION OF EMBODIMENTS

Hereinafter, embodiments of the invention will be described with reference to the accompanying drawings.

Embodiment 1

In the present embodiment, an apparatus configuration and a surface roughness measurement principle will be described. A schematic configuration of a surface measurement apparatus is shown in FIG. 1(a). Main components are a chuck 102 that suctions a wafer 101, a rotational stage 103 on which the chuck 101 is mounted, a linear stage 104 on which the rotational stage 101 is mounted, a light source 105, an illumination optical system 106 having a lens, a mirror or the like, detection systems 181 to 186 having a lens, a mirror or the like, a signal processing system 107, a control system 108, and an operation system 109.

Arrangement of the detection systems 181 to 186 is shown in FIG. 1(b). As illumination light supplied from the illumination optical system 108 is converged, a beam spot 121 is formed on a surface of the wafer 101. Scattered light generated from the beam spot 121 is detected by the plural detection systems 181 to 186. The detection systems 181 to 186 have the same elevation angle, and are arranged with different azimuth angles. Since the illumination light is obliquely supplied to the wafer 101 and the detection systems 181 to 186 detect the scattered light, the surface measurement apparatus of the present embodiment may be expressed as a so-called dark field type apparatus. Further, shapes of openings of the detection systems 181 to 186 are provided to be substantially circular when viewing the wafer 101 in a normal direction thereof, as shown in FIG. 1(b).

A configuration example of the detection system 183 is shown in FIG. 1(c) (this is similarly applied to the other detection systems). The detection system 183 has a detection optical system 191 having an optical axis 193, and a photoelectric converter 192. The beam spot 121 is formed on the wafer 101 by the illumination light supplied to the wafer 101, and the light is scattered with each elevation angle and azimuth angle from the beam spot 121. The scattered light is converged by the detection optical system 191 having a certain numerical aperture, and the detection optical system 191 includes plural lenses (lens group), so that a so-called light condensing optical system or imaging optical system is configured. The converged scattered light passes through a spatial filter or a polarizing filter to cut off undesirable light components, and then, is photoelectrically converted by the photoelectric converter 192. A signal obtained by the photoelectric conversion is an electric current or a voltage. Then, the signal is AD-converted and is processed by the signal processing system 107. As an example of the photoelectric converter 192, a photo multiplier, an avalanche hot diode array, or a photon counting array in which plural photon counting elements are arranged may be used.

FIG. 1(d) shows a scanning method of the beam spot 121. The wafer 101 rotates as indicated by an arrow 131 by the stage 102 while moving straight in a direction of an arrow 132 by the stage 103. As the beam spot 121 scans the entire surface of the wafer 101 by the linear movement and the rotational movement, locus thereof forms a concentric circular shape or a spiral shape. Coordinates of the beam spot 121 may be managed by a distance from a wafer center and a rotation angle (a so-called polar coordinate system). The rotation angle may be expressed with reference to a virtual reference line 135 (for example, a half straight line that passes a notch 134 and the wafer center) on the wafer.

FIG. 1(e) is a diagram illustrating an output signal from each of the detection systems 181 to 186. A horizontal axis 141 indicates time or coordinates in the same direction as the rotational direction 131 of the stage, and a vertical axis 142 indicates the size of the output signal. The scattered light due to the micro roughness of the wafer 101 is incident onto the detection systems 181 to 186, and a waveform indicated by a micro roughness signal 143 is obtained with respect to each of the detection systems 181 to 186. A value and coordinates thereof are stored for each of the detection systems 181 to 186. Further, if the beam spot 121 crosses a defect or the like, an especially large signal 144 is detected. The defect signal 144 is separated from the signal 143 by a high pass filter (HPF), for example, in the signal processing system 107, and a value and coordinates thereof are stored as a defect.

Handling of the micro roughness signal 143 and the defect signal 144 will be described. The removal of the defect signal 144 from the micro roughness signal 143 may be performed based on determination using a signal size, instead of the above-described frequency area separation. That is, if the signal size is equal to or smaller than a specific size (threshold value), an acquired signal may be considered as a micro roughness signal. The threshold value may be set as a fixed value in advance, or may be set in real time from a signal capable of being obviously determined as a micro roughness signal.

Further, as a method for acquiring the micro roughness signal, a method in which the defect signal 144 is not separated from the micro roughness signal 143 may also be used. For example, a method for averaging (merge) signals from the detection systems 181 to 186 for a certain period of time or in a certain wafer area may be used. As the averaging method, a method for dividing six detection systems 181 to 186 into plural groups to perform averaging for the divided groups may be used. More specifically, the detection system 181 and the detection system 186 may be a first group, the detection system 182 and the detection system 185 may be a second group, and the detection system 183 and the detection system 184 may be a third group, and the averaging may be performed for each group. An operator can arbitrarily set detection systems to be combined, but it is preferable to adopt a combination in which a change due to the micro roughness can be sharply captured. When an acquirement interval of a sensor output due to the scattered light is sufficiently narrow, the frequency of the defect signal with respect to the acquired signal is extremely small. Thus, even though the intensity of the defect signal 144 is stronger than the intensity of the micro roughness signal 143, a defect signal after averaging may be handled in the same way as the micro roughness signal. Further, if the averaging is performed, it is possible to reduce a processing load of the signal processing system 107. Hereinabove, the measurement method of the intensity of scattered light incident onto each detection system on the entire surface of the wafer has been described.

Next, a procedure of calculating a surface roughness from a measured intensity of scattered light will be described. The procedure is divided into (1) a procedure of estimating a substantial PSD function of a surface from the intensity of scattered light, and (2) a procedure of calculating a substantial roughness of the surface from the PSD function.

First, the PSD function will be described. When a surface shape is expressed using three-dimensional coordinates (X, Y, Z), a height Z may be two-dimensionally Fourier transformed with respect to (X, Y), and a value obtained by squaring amplitude thereof may be expressed as a spatial frequency spectrum. The spatial frequency spectrum becomes a function P(fx, fy) in which (fx, fy) which are reciprocals of (X, Y) are used as variables. P(fr) obtained by expressing the function P using $fr=\sqrt{(fx \times fx + fy \times fy)}$ indicates a power spectral density (PSD) function. The PSD function has the size of a surface roughness and cycle information. That is, the PSD function may be expressed as an example of a function that expresses the spatial frequency spectrum. Further, acquirement of the PSD function and acquirement of information about the surface shape are substantially equivalent to each other.

Next, the procedure of estimating the PSD function from the intensity of scattered light will be described with reference to FIG. 2. First, the operator inputs a material and a film thickness of a measurement target through the operation system 109 (step 201 in FIG. 2). This information is used for a measurement condition of scattered light or a correction coefficient k.

Next, the intensity of scattered light is measured by the detection systems 181 to 186 using the method described with reference to FIG. 1 (step 202 in FIG. 2). As the intensity of scattered light, a value measured in advance may be stored in the signal processing system 107, and the value may be read.

Then, the signal processing system 107 calculates a total sum Σ of detection signals (step 203 in FIG. 2), and divides each signal of the detection systems 181 to 186 by the total sum Σ (step 204 in FIG. 2). This means that the ratio of each detection system to the total sum of the signals is obtained.

In parallel with steps 202 to 204, the signal processing system 107 refers to a predetermined correction coefficient K that is stored in advance based on the originally input material and film thickness (step 207 in FIG. 2), and multiplies the correction coefficient K by the ratio of each detection system calculated in step 204 (step 205 in FIG. 2).

The signal processing system 107 estimates the PSD function from the signal ratio and the total sum Σ acquired in this way (step 206 in FIG. 2). The estimation of the PSD function is performed by the signal processing system 107 using a library recorded in memory thereof. In the library, the relationship between the PSD function and the detection signal in the optical condition is recorded with respect to a variety of known micro roughnesses. The signal processing system 107 compares the detected signal with the library to estimate the PSD function. The estimated PSD function and a surface roughness (which will be described later) are associated with coordinates on the wafer to be stored in the memory of the signal processing system 107.

Next, the PSD function estimated in the present embodiment will be described with reference to FIG. 3. A horizontal axis 301 indicates the above-described f=fr, and a vertical axis 302 indicates the size of the spatial frequency spectrum, which represents a double-logarithmic graph.

FIG. 3(a) shows a first PSD function, which is referred to as an ABC model hereinafter. The ABC model is expressed as $PSD(f)=A/(1+Bf^2)^{c/2}$ using parameters A, B, and C, with respect to the spatial frequency f of the surface roughness. On a low frequency side, the PSD maintains a constant value, and on a high frequency side, the PSD becomes small. The constant value on the low frequency side is represented as A, an inclination on the high frequency side is represented as −C/2, and a spatial frequency at a branch point is represented as 1/B.

FIG. 3(b) shows a second PSD function, which is referred to as a fractal ABC model hereinafter. This model is expressed as $PSD(f)=A/(1+Bf^2)^{c/2}+K/f^M$ using parameters A, B, C, K, and M. The fractal ABC model has a feature that the value is larger with a segment of K and a inclination of −M on a low frequency side, compared with the ABC model.

FIG. 3(c) shows a third PSD function, which is referred to as a Double ABC model hereinafter. This model is expressed as $PSD(f)=A1/(1+B1f^2)^{c1/2}+A2/(1+B2f^2)^{c2/2}$ using parameters A1, B1, C1, A2, B2, and C2. Addition of two different ABC models is performed. Hereinabove, the procedure of calculating the PSD function from the intensity of scattered light has been described, but the present embodiment may define PSD functions having different waveforms. As shown in FIG. 3, the PSD functions become continuous smooth functions.

Next, the procedure of calculating the surface roughness from the PSD function will be described. FIG. 4 is a diagram illustrating the relationship between the PSD function and the surface roughness (RMS roughness). The RMS roughness becomes a value obtained by integrating a product of a PSD function 401 and a spatial, frequency f in a certain spatial frequency band (band $f_1$ to $f_2$ in FIG. 4). When an integration interval f1 to f2 is arbitrarily selected and the RMS roughness in the interval is set as RMS(f1, f2), RMS(f1, f2)=$\sqrt{(2\pi f^2\int_{f1} PSD(f)\times fdf)}$.

FIG. 5 shows the procedure of calculating the RMS roughness. First, the arbitrary spatial frequency band f1 to f2 is selected (501 in FIG. 5). Then, the RMS roughness is calculated from RMS(f1, f2)=$\sqrt{(2\pi f^2\int_{f1} PSD(f)\times fdf)}$. The RMS roughness can be acquired by this procedure. Hereinbefore, the procedure of calculating the surface roughness from the PSD function has been described.

Next, the correction coefficient k described in step 207 in FIG. 2 will be described. The correction coefficient k functions to correct the surface roughness calculated from the intensity of scattered light to the surface roughness measured by the AFM. In other words, it can be said that the surface roughness that is optically obtained by the correction coefficient k comes close to an actual roughness. Further, it can be said that the correction coefficient k is defined by a result obtained by measuring a sample which is substantially the same as a sample by an optical method and a result obtained by measuring the sample by a method different from the optical method. Further, it can be said that the different method refers to a method with high resolution (for example, measurement using an AFM) compared with the optical method. A value of the correction coefficient k is prepared with respect to each of the detection systems 181 to 186 according to wafer information (for example, according to each material that forms the wafer, or each film type on the wafer). That is, it can be said that the correction coefficient k is changed according to the material that forms the sample and the film type on the sample.

FIG. 6 shows a procedure of calculating the correction coefficient k. In this procedure, in addition to the surface measurement apparatus (which may be expressed as a first apparatus or an optical apparatus) described in FIG. 1, an apparatus (which may be expressed as a second apparatus that measures the surface by a measurement principle different from that of the first apparatus) capable of directly measuring height information of the surface is prepared. Here, as the second apparatus, an AFM with high resolution compared with the surface measurement apparatus will be described as an example. First, a wafer which is substantially the same as a measurement target (hereinafter, referred to as the same wafer) is prepared (step 601 in FIG. 6).

Height data is acquired using the AFM with respect to the same wafer (step 602 in FIG. 6).

Next, a PSD function is calculated using two-dimensional Fourier transform from the acquired height data (step 603 in FIG. 6).

The intensity of scattered light incident onto the detection systems 181 to 186 of the surface measurement apparatus is calculated using the PSD function (step 604 in FIG. 6). The calculation of the intensity of scattered light is performed using the PSD function, a refractive index of a material of the wafer surface, and an illumination condition as input data, and using a bidirectional reflectance distribution function (BRDF).

Next, the total sum Σ of the intensity of scattered light incident onto the respective detection systems acquired in step 604 is calculated (step 605 in FIG. 6), and the intensity of scattered light of each detection system is divided by the total sum Σ to calculate a signal ratio of each detection system (step 606 in FIG. 6). This signal ratio indicates a signal ratio calculated from AFM data.

In parallel with step 602 to step 606, the intensity of scattered light is acquired using the surface measurement apparatus with respect to the same wafer (607 in FIG. 6).

A total sum Σ of the detection signals acquired in step 607 is calculated (608 in FIG. 6), and the detection signal of each of the detection systems 181 to 186 is divided by the total sum Σ to calculate a signal ratio of each of the detection systems 181 to 186 (609 in FIG. 6). This signal ratio indicates a signal ratio which is optically measured.

Next, the correction coefficient k is calculated from the following expression with respect to the detection systems 181 to 186. k=(signal ratio acquired from AFM)/(signal ratio acquired from measurement of the intensity of scattered light) (step 610 in FIG. 6). In this way, the correction coefficient k with respect to one material and one film type is calculated. When calculating a correction coefficient of another wafer, the procedure returns to flow 601, and in other cases, the procedure is terminated (step 611 in FIG. 6). The acquired correction coefficient k is used in step 205 in FIG. 2.

Here, an output example of model parameters of a PSD function for a certain intensity of scattered light will be described with reference to FIG. 7. The PSD function uses an ABC model as an example. When a signal of each detection system measured by the surface measurement apparatus and multiplied by the correction coefficient k is a signal 701, ABC parameters corresponding thereto include plural sets of parameters 702. When the signal is a signal 703, the ABC parameters include plural sets of parameters 704. In the present embodiment, plural ABC parameters correspond to one set of signal ratios.

A reason why the plural ABC parameters correspond to one set of signal ratios will be described with reference to FIG. 8. Reference numerals 802, 803, and 804 indicate PSD functions having different B parameters. A spatial frequency band capable of being measured by the surface measurement apparatus is determined by an angle of incident light with respect to a wafer and a wavelength of the light. When the band corresponds to 801, it is difficult to separate the PSD functions 802 to 804 from the measured value. Thus, as shown in FIG. 7, plural sets of ABC parameters correspond to one set of signal ratios. Further, the RMS roughness may be calculated with respect to each of the ABC parameters. Accordingly, plural pieces of RMS roughness correspond to one set of signal ratios. The RMS roughness may employ values calculated in the following (1) and (2). (1) Average values Avg(Ai), Avg(Bi), and Avg(Ci) of plural ABC parameters Ai, Bi, and Ci which are candidates are calculated. The RMS roughness is calculated using the values and an arbitrary spatial frequency area f1 to f2. That is, the RMS roughness is expressed as RMS=Function (Avg(Ai), Avg(Bi), Avg(Ci), f1, f2). (2) The RMS roughness is calculated using the plural ABC parameters Ai, Bi, and Ci which are the candidates and the arbitrary spatial frequency areas f1 to f2. That is, the RMS roughness is expressed as RMSi=Function (Ai, Bi, Ci, f1, f2). An average value of the RMS roughness is used as the RMS roughness. That is, the RMS roughness is expressed as RMS=Avg(RMSi). An operator may arbitrarily select (1) or (2).

Hereinabove, an example in which the detection systems 181 to 186 include the light condensing optical system or the imaging optical system has been described, but the detection system 183 also includes a Fourier transform optical system as shown in FIG. 9 (this is similarly applied to the other detection systems). When the detection system 183 is the Fourier transform optical system, scattered light from the wafer 101 is collimated by a detection optical system 901 to become parallel light which is substantially parallel to the optical axis 193. The parallel light is photoelectrically converted by a sensor 902 in which plural photoelectric converters are arranged. If the Fourier transform optical system is employed in the detection systems 181 to 186, it is possible to measure spatial distribution of the scattered light with higher resolution, and to improve estimation accuracy of the PSD function. Further, the same effect can also be acquired by increasing the number of detection systems.

According to the present embodiment, it is possible to acquire information relating to a wafer surface at a relatively high speed. Further, according to the present embodiment, it is possible to estimate information other than a spatial frequency band capable of being measured.

Embodiment 2

In Embodiment 1, the method for measuring the intensity of scattered light from one beam spot on the wafer to calculate the surface roughness has been described. In the present embodiment, a data handling method for the entire surface of a wafer, a roughness display method, and a comparison analysis example with respect to a defect detection function will be described.

An area where data is merged will be described with reference to FIG. 10. FIG. 10(a) shows a state where data (the intensity of scattered light, and PSD related parameters) on respective beam spots 1012 (in which the size of one spot is several $\mu^2$) is all managed. Here, the management includes storing data acquired for each certain unit area in the signal processing system 107 and the control system 108, and displaying the data on a display or the like in the operation system 109. If a wafer surface 1001 is scanned in a concentric circular shape or a spiral shape, boundary lines 1011 may be defined in a radius direction. An interval between the boundary lines 1011 substantially corresponds to the length of the beam spot in the radius direction. Further, an area between two boundary lines 1011 is divided in a circumferential direction to manage a value for each beam spot 1012. That is, it can be said that FIG. 10(a) shows a state where data acquired for each area of the beam spot 1012 is substantially managed.

Further, it is also possible to manage data acquired for each unit area larger than the size of the beam spot. For example, in the present embodiment, as shown in FIG. 10(b), data may be averaged in a boundary divided by radial boundary lines 1021 and 1022 and circumferential boundary lines 1023, 1024, and 1025 to manage a value thereof. In the case of FIG. 10, an interval between the boundary lines 1021 and 1022 is longer than the length of the beam spot in the radius direction, and the area of a unit area defined by the boundary lines 1021, 1022, 1023, 1024, and 1025 is larger than the area of the beam spot.

Further, as shown in FIG. 10(c), it is also possible to manage data according to design data (for example, die division pattern) of a predetermined pattern to be formed on a wafer. In the case of FIG. 10(c), a unit area 1031 is formed by referring to data of a die manufactured on a wafer (for example, coordinates and dimensions). The data is averaged in the unit area 1031, and the averaged value is managed. The design data may be stored in advance in the memory of the signal processing system 107, or may be downloaded from an external processing device through a network.

Further, as shown in FIG. 10(d), it is also possible to manage data in an arbitrary area designated by an operator. In FIG. 10(d), the operator designates an area 1042 of an arbitrary shape on a wafer map by a mouse pointer 1041 in the operation system 109. Then, data is averaged in the area, and the averaged value is managed. In the case of FIG. 10(d), the area 1042 designated by the operator becomes a unit area. The operator may arbitrarily select which management method among FIG. 10(a) to FIG. 10(d) is employed.

Next, a display method of the acquired RMS roughness FIG. 11 will be described with reference to FIG. 11. FIG. 11 is a diagram illustrating a case where data is managed by the method shown in FIG. 10(a) and the RMS roughness is displayed. As described with reference to FIG. 4, the value of the RMS roughness is determined in the spatial frequency band.

First, a display section in the operation system 109 includes a mechanism for designating the spatial frequency band. As a designation method, there is a method performed by input of numerical values. A lower limit f1 of a band is input into a box 1103, and an upper limit f2 is input into a box 1104. Further, a scale bar 1105 is prepared, and a lower limit value 1106 and an upper limit value 1107 of a spatial frequency in consideration of the performance of the apparatus are set at opposite ends. Here, a lower limit value 1108 and an upper limit value 1109 of the spatial frequency band where the RMS roughness is calculated are set between the lower limit value 1106 and the upper limit value 1107, and a mechanism capable of continuously changing the lower limit value 1108 and the upper limit value 1109 using a mouse pointer or the like is provided. Values corresponding to the positions of the limit values 1108 and 1109 are displayed in the boxes 1103 and 1104, respectively. With respect to the spatial frequency band determined in this way, the RMS roughness is calculated from the expression in FIG. 4, and is displayed on a wafer map 1001. As a display example of the RMS roughness, a contour display is used. Contour lines 1101 and representative values 1102 are displayed by the RMS roughness. A gradation display including color bars or a pattern display may be employed, instead of the contour display.

As an example in which quantitative display is performed, a histogram display may be used instead of the figure display on the wafer map 1101. The histogram display will be described with reference to FIG. 12. A procedure for designating a spatial frequency band to calculate the RMS roughness is the same as in FIG. 11. In FIG. 12(a), an area having a certain RMS roughness (range) is counted to form a histogram. Further, a cumulative histogram obtained by sequentially accumulating the RMS roughness from a small RMS roughness side of the histogram in FIG. 12(a) is shown in FIG. 12(b). The vertical axis may be the frequency or ratio.

Next, a comparison analysis example of data on PSD parameters and RMS roughness and data on defect inspection will be described with reference to FIG. 13. FIG. 13 is an example in which data on obtained surface roughnesses and defects is displayed on the wafer map 1001. The defect data (for example, coordinates or type) may be obtained using the surface measurement apparatus of the present embodiment, or other optical type inspection apparatuses, or may be obtained using other apparatuses (for example, an apparatus that detects or classifies defects using an electron beam). In FIG. 13, the RMS roughness is expressed by the contours 1101 on the wafer map 1001, and the defects are expressed by marks 1301. Further, the types of the defects are divided by different shape signs as indicated by reference numeral 1302, and are displayed so that an operator can easily recognize the difference between the defect types. According to such a display, it is possible to visually recognize the relationship between the defect and the surface roughness. In FIG. 13, the data on the defect and the surface roughness is displayed on substantially the same wafer map 1001, but may be respectively displayed on different wafer maps 1001.

Further, in the present embodiment, an operator may select an arbitrary type or an arbitrary defect from the wafer map 1001 in FIG. 13, and an average PSD function in an area corresponding to the selected defect may be displayed. A display example indicating the relationship between a defect type and a PSD function will be described with reference to FIG. 14. FIG. 14 shows a function of displaying an average PSD function in an area corresponding to a defect for each defect type in FIG. 13. The operator selects an arbitrary type defect from reference numeral 1302 using a predetermined input device. FIG. 14(a) shows an average PSD function 1303 in an area corresponding to a defect A. FIG. 14(b) shows an average PSD function 1304 in an area corresponding to a defect B. FIG. 14(c) shows an average PSD function 1305 in an area corresponding to a defect other than the defects A and B. Thus, it is possible to recognize the relationship between reasons why each defect occurs and the PSD function. The operator selects a specific defect from the wafer map 1001 instead of reference numeral 1302, and may display a PSD function with respect to the selected specific defect.

Embodiment 3

Next, Embodiment 3 will be described. In the present embodiment, the contents described in Embodiments 1 and 2 are applied as a system (so-called process monitor) that monitors an abnormality in a wafer processing process.

FIG. 15 is a diagram illustrating the present embodiment. FIG. 15(a) shows a procedure of process monitoring in the present embodiment. A wafer is transported to a manufacturing device (step 1401). Predetermined processes are performed for the transported wafer (step 1402). Here, the processes include polishing, washing, deposition, and etching for the wafer.

Surface measurement is performed for the wafer for which the predetermined processes are performed, according to the contents described in Embodiments 1 and 2 (step 1403).

If there is an abnormality in the measurement result, the result is fed back to the manufacturing device (step 1405). The feedback includes a change in polishing conditions, a change in washing conditions, a change in deposition conditions, or a change in etching conditions. If there is no abnormality, the process monitoring is terminated.

FIG. 15(b) is a diagram illustrating step 1404. It is assumed that a PSD function acquired at a certain time point 1409 on a time axis 1408 is a function 1410. On the other hand, it is assumed that a PSD function measured at a different time point 1411 (more specifically, later in time) is a function 1412. When comparing the function 1408 with the function 1410, it is understood that a low frequency portion 1413 of the PSD function increases at the time point 1411 compared with the time point 1409. This indicates that roughness at a low frequency, that is, at a long cycle increases. That is, this indicates that the surface state is changed according to a certain change in the manufacturing device. In this way, by comparing the shapes of the PSD functions acquired at different time points in the signal processing system 107, it is possible to recognize the change in the surface state. In FIG. 15(b), two PSD functions that are actually acquired at different time points are compared, but it is not necessary to actually measure a reference PSD function in the determination of step 1404, and the operator may arbitrarily define the reference PSD function using the signal processing system 107. Further, it is possible to change the reference PSD function in the determination of step 1404 according to the contents of the processes performed for the wafer. Further, focusing on which band of the PSD function to determine an abnormality for may be arbitrarily changed according to the contents of the processes.

According to the present embodiment, it is possible to understand the degree of change in a specific spatial frequency band with respect to the entire surface of a wafer and all the wafers. Thus, it is possible to provide significant information for narrowing down abnormalities of the respective processes and the respective manufacturing devices, and to provide a rapid feedback with respect to the wafer processing process.

Embodiment 4

Next, Embodiment 4 will be described. The present embodiment shows an example in which a surface of a wafer is measured using a measurement apparatus capable of inspecting and measuring the surface with a resolution higher than that of the surface measurement apparatus and the surface measurement apparatus according to Embodiments 1 to 3.

FIG. 16 is a conceptual diagram illustrating the present embodiment. A system of the present embodiment includes the surface measurement apparatus (first measurement apparatus) according to Embodiments 1 to 3 and a measurement apparatus (second measurement apparatus) capable of measuring a surface with a resolution higher than that of the surface measurement apparatus. As an example of the second measurement apparatus, the above-described atomic force microscope (AFM), a multi purpose scanning electron microscope (MP-SEM) capable of measuring defects and performing detection and classification, or a critical dimension scanning electron microscope (CD-SEM) that measures a line width of a pattern formed on a wafer may be used.

The AFM or SEM can measure and observe a high resolution surface shape, but has a weak point in that visual field thereof is relatively narrow. Further, it is necessary to determine measurement conditions according to a measuring object.

The present embodiment is based on these considerations.

An operation principle of the AFM will be described with reference to FIG. 17(a). A probe 1603 of which tip thereof has a size of several 10 nm comes close to a wafer 101 on a moving stage 1607 in a range where an interatomic force acts. Here, a laser 1602 emitted from a light source 1601 is reflected from an upper portion of a probe tip, and a reflected light 1604 is detected by a light detection system 1605 in which areas are divided and is recorded by a signal processing system 1608. If the stage 1607 moves by a control system 1606, the probe 1603 is displaced up and down along a surface shape of the wafer 101. Thus, the light 1604 reflected from the upper portion of the probe tip is displaced, and the intensity of received light in each divided area of the light detection system 1605 is changed. The change is converted into the displacement of the probe by the signal processing system 1608 and is associated with the coordinates of the wafer 101, and thus, it is possible to measure the surface shape of the wafer.

The AFM includes a mode in which the probe 1603 is substantially in contact with a sample in the atmosphere for scanning (so-called contact mode), a mode in which the probe 1603 is not in contact with the sample in the vacuum and is vibrated with a predetermined resonance frequency to measure a shift of the frequency (so-called non-contact mode), or other measurement modes (for example, a mode in which a distance between the sample and the probe is changed so that the probe leaps, when the sample is scanned by the non-contact mode).

Next, an operation principle of the MP-SEM will be described with reference to FIG. 17(b). An electron beam 1612 emitted from an electron gun 1611 is focused by a focusing lens 1613. Then, the beam passes through polarizing coils 1614 and 1615 controlled by a control section 1620 and is narrowed by an objective lens to illuminate the wafer 101. A reflected electron, a secondary electron or the like 1617 at the moment is detected by a detection system, and is recorded in a signal processing system 1619. The wafer is scanned with the electron beam by the control system 1620, and the surface shape of the wafer can be observed from the position at that time and the size of the detection signal. With respect to the CD-SEM, by performing pattern matching between a predetermined area observed by the MP-SEM and a predetermined reference image, it is possible to perform measurement of the line width.

FIG. 18 shows a flow of measurement of the present embodiment. First, surface measurement of the entire surface of a wafer is performed by the surface measurement apparatus (first apparatus) (step 1701). Here, an operator records coordinates to be specifically measured into the signal processing system 107, for example, as coordinates relating to a notch (134 in FIG. 1(d)) of the wafer, for example. In step 1701, estimation of the surface roughness is also performed.

Thereafter, measurement conditions of the second apparatus are determined from the surface roughness estimated in step 1701 (step 1702). In the determination, the signal processing system 107 may be used, or instead, an external processing system may be used. Here, the measurement conditions include the above-described plural measurement modes for the AFM, and an acceleration voltage for the SEM.

Then, the second apparatus performs inspection in the measurement conditions determined in step 1702 for at least the coordinates designated by the operator in step 1701 (step 1703).

The result of step 1701 and the result of step 1703 are combined on the same wafer map (step 1704). Thus, it is possible to compare and analyze two measurement results. That is, it is possible to compare an entire surface state of the wafer with a partial state of the wafer.

Embodiment 5

Next, Embodiment 5 will be described. The present embodiment is characterized in that at least one of a PSD function and a surface roughness of a wafer on which a certain film (for example, particularly, a transparent film) is formed on a surface thereof (hereinafter, referred to as a transparent film wafer) is obtained.

First, with respect to a wafer with an insufficient non-transparent film with respect to a wavelength, that is, a film that does not generate scattered light from a lower layer with reference to a surface of the film, the PSD function and the surface roughness may be measured by at least one of the methods according to Embodiments 1 to 4.

On the other hand, with respect to a wafer with a transparent film such as $SiO_2$ or $Si_3N_4$, it is preferable to acquire information relating to a surface thereof before the transparent film is deposited. The reason is because, in the case of the transparent film, scattered light from the wafer with the transparent film is measured as the sum of scattered light from a film surface and scattered light from an interface between an under film layer and the wafer surface.

Thus, in the present embodiment, at least one of the PSD function and the surface roughness of the transparent film surface of the transparent film wafer is acquired by a flow shown in FIG. 19. First, data on scattered light with respect to a wafer with no transparent film is acquired (step 1901). The process of step 1901 includes at least one of measurement of data on scattered light using the surface measurement apparatus according to Embodiment 1 and acquirement of data on scattered light by performing a predetermined process for measurement data of the AFM. The process of step 1901 is performed with respect to each of the detection systems 181 to 186. Data acquired in step 1901 is stored in the signal processing system 107.

In measurement of the transparent film wafer, the data acquired in step 1901 is loaded from the signal processing system 107 (step 1902).

Next, measurement of scattered light is performed for the transparent film wafer using at least one of the surface measurement apparatuses according to Embodiments 1 to 4 (step 1903).

Since the data acquired in step 1901 is handled so as to be substantially equivalent to the scattered light from the interface, the signal processing system 107 removes the result obtained in step 1901 from the result obtained in step 1903 (step 1904). The process of step 1904 is performed for each of the detection systems 181 to 186. Through the process of step 1904, data used for subsequent calculations becomes data indicating the scattered light from the transparent film surface.

At least one of the methods according to Embodiment 1 to 4 is applied to the result obtained in step 1904, to thereby acquire the PSD function and the surface roughness for the transparent film surface (step 1905).

According to the present embodiment, even when measuring a wafer on which a certain film (for example, particularly, a transparent film) is formed, it is possible to correctly obtain a PSD function and a surface roughness. If the surface roughness of the wafer before deposition is sufficiently constant, it is not necessary to measure the surface roughness with respect to all the wafers before deposition. That is, the data acquired in step 1901 may be used in calculation for a different wafer on which substantially the same type of film is formed.

Hereinbefore, the embodiments of the invention have been described, but the invention is not limited to the embodiments. Here, the wafer refers to a wafer in a broad sense, such as a silicon wafer, a substrate made of a material other than silicon, or other samples. The contents described in this specification may be applied to a defect inspection device that detects a defect such as a scar or a foreign material on a sample. Further, the contents described in the respective embodiments may be partially removed, or may be mutually exchanged or combined.

REFERENCE SIGNS LIST

101 WAFER
102 CHUCK
103 ROTATIONAL STAGE
104 LINEAR STAGE
105 LIGHT SOURCE
106 ILLUMINATION OPTICAL SYSTEM
107 SIGNAL PROCESSING SYSTEM
108 CONTROL SYSTEM
109 OPERATION SYSTEM
181 DETECTION SYSTEM
182 DETECTION SYSTEM
183 DETECTION SYSTEM
184 DETECTION SYSTEM
185 DETECTION SYSTEM
186 DETECTION SYSTEM

The invention claimed is:

1. A surface measurement apparatus comprising:
an illumination optical system that supplies light to a sample;
a plurality of detection optical systems that detects and measures intensity of scattered light from the sample; and
a processing section executing stored instructions to:
acquire a total sum of detection signals from the plurality of detection optical systems,
divide each detection signal by the total sum to acquire a ratio of the total sum of the detection signals and each detection signal,
refer to a predetermined correction coefficient and multiply the predetermined correction coefficient by the ratio for each detection signal,
acquire a continuous spatial frequency spectrum for the sample using the acquired ratio, the acquired total sum of the detection signals, and a library,
associate defect information of the sample with surface roughness information of the sample as relationship information using different indicators that respectively identify defect type and location of the defect type relative to the surface roughness information and output the relationship information including the different indictors for display, and
wherein the predetermined correction coefficient is expressed as a result obtained by measuring a second sample which is substantially same as the sample by an optical method and a result obtained by a method different from the optical method.

2. The surface measurement apparatus according to claim 1,
wherein the different method is a measurement method with a resolution higher than that of the optical method.

3. The surface measurement apparatus according to claim 2,
wherein the processing section acquires a surface roughness of the sample from the spatial frequency spectrum.

4. The surface measurement apparatus according to claim 3,
wherein the processing section associates the spatial frequency spectrum with coordinates of the sample, and averages the spatial frequency spectrum for each unit area.

5. The surface measurement apparatus according to claim 4,
wherein the unit area is arbitrarily defined.

6. The surface measurement apparatus according to claim 4,
wherein the unit area is larger than an area of an illumination area formed on the sample.

7. The surface measurement apparatus according to claim 4,
wherein the unit area is determined by a pattern to be formed on the sample.

8. The surface measurement apparatus according to claim 7,
wherein the pattern corresponds to a die.

9. The surface measurement apparatus according to claim 4, further comprising:
a display section that displays the defect information of the sample and the surface roughness information of the sample on substantially the same map is provided.

10. The surface measurement apparatus according to claim 9,
wherein the display section displays a spatial frequency spectrum for a specific defect from the displayed defect information.

11. The surface measurement apparatus according to claim 10,
wherein the processing section determines an abnormality of a process for processing the sample from comparison of at least two spatial frequency spectrums acquired at different times.

12. The surface measurement apparatus according to claim 11, wherein the processing section determines a measurement condition for measurement, using the different method, from the surface roughness.

13. The surface measurement apparatus according to claim 1,
wherein the processing section acquires a surface roughness of the sample from the spatial frequency spectrum.

14. The surface measurement apparatus according to claim 1,
wherein the processing section associates the spatial frequency spectrum with coordinates of the sample, and averages the spatial frequency spectrum for each unit area.

15. The surface measurement apparatus according to claim 14,
wherein the unit area is arbitrarily defined.

16. The surface measurement apparatus according to claim 14,
wherein the unit area is larger than an area of an illumination area formed on the sample.

17. The surface measurement apparatus according to claim 14,
wherein the unit area is determined by a pattern to be formed on the sample.

18. The surface measurement apparatus according to claim 17,
wherein the pattern corresponds to a die.

19. The surface measurement apparatus according to claim 1,
wherein the processing section acquires a surface roughness of the sample from the spatial frequency spectrum,
the surface measurement apparatus further comprising:
a display section that displays the defect information of the sample and the surface roughness information of the sample on substantially the same map is provided.

20. The surface measurement apparatus according to claim 19,
wherein the display section displays a spatial frequency spectrum for a specific defect from the displayed defect information.

21. The surface measurement apparatus according to claim 1,
wherein the processing section determines an abnormality of a process for processing the sample from comparison of at least two spatial frequency spectrums acquired at different times.

22. The surface measurement apparatus according to claim 1,
wherein the processing section acquires a surface roughness of the sample from the spatial frequency spectrum, and determines a measurement condition for measuring the sample, using a method different from an optical method, from the surface roughness.

23. The surface measurement apparatus according to claim 1,
wherein the detection optical system includes a Fourier transform optical system.

24. The surface measurement apparatus according to claim 1,
wherein the processing section acquires a spatial frequency spectrum for a transparent film surface.

25. The surface measurement apparatus according to claim 24,
wherein the processing section acquires the spatial frequency spectrum for the transparent film surface using signals acquired by removing signals from a sample on which a transparent film is not formed from the detection signals from the plurality of detection optical systems.

* * * * *